(12) United States Patent
Marion et al.

(10) Patent No.: US 7,759,261 B2
(45) Date of Patent: Jul. 20, 2010

(54) METHOD FOR PRODUCING LAYERS LOCATED ON A HYBRID CIRCUIT

(75) Inventors: Francois Marion, St Martin le Vinoux (FR); Philippe Rambaud, Claix (FR); Lydie Mathieu, Pommiers-la-Placette (FR)

(73) Assignee: Commissariat a l'Energie Atomique, Paris (FR)

( * ) Notice: Subject to any disclaimer, the term of this patent is extended or adjusted under 35 U.S.C. 154(b) by 440 days.

(21) Appl. No.: 11/576,056

(22) PCT Filed: Oct. 13, 2004

(86) PCT No.: PCT/FR2004/002603

§ 371 (c)(1),
(2), (4) Date: Aug. 8, 2007

(87) PCT Pub. No.: WO2006/040419

PCT Pub. Date: Apr. 20, 2006

(65) Prior Publication Data

US 2008/0045037 A1 Feb. 21, 2008

(51) Int. Cl.
*H01L 21/31* (2006.01)

(52) U.S. Cl. ............... 438/780; 438/699; 257/E21.027; 257/E21.243; 257/E51.027

(58) Field of Classification Search ................ 438/699, 438/780; 257/E21.012, E21.243, E51.027
See application file for complete search history.

(56) References Cited

U.S. PATENT DOCUMENTS

| 4,963,389 A | 10/1990 | Takada et al. |
| 5,574,285 A | 11/1996 | Marion et al. |
| 5,661,343 A | 8/1997 | Takahashi et al. |
| 6,467,674 B1 | 10/2002 | Mihara |

FOREIGN PATENT DOCUMENTS

| EP | 0 573 212 | 12/1993 |
| FR | 2 858 716 | 2/2005 |
| JP | 1 218042 | 8/1989 |
| JP | 05 175629 | 7/1993 |

*Primary Examiner*—Andy Huynh
(74) *Attorney, Agent, or Firm*—Oblon, Spivak, McClelland, Maier & Neustadt, L.L.P.

(57) ABSTRACT

A method for obtaining layers defined on a hybrid circuit. The hybrid circuit including a substrate and at least one elementary circuit that includes a first facet and a second facet, being hybridized via the second facet to a facet of the substrate. This facet of the substrate and each elementary circuit are coated with a first layer, the first layer is removed from the first facet of the elementary circuit, the first facet and the subsisting part of the first layer are coated with a second layer, and the subsisting part and the second layer covering it are removed. Such a method may, for example, find application to obtaining an antireflection or metal layer on a chip.

7 Claims, 2 Drawing Sheets

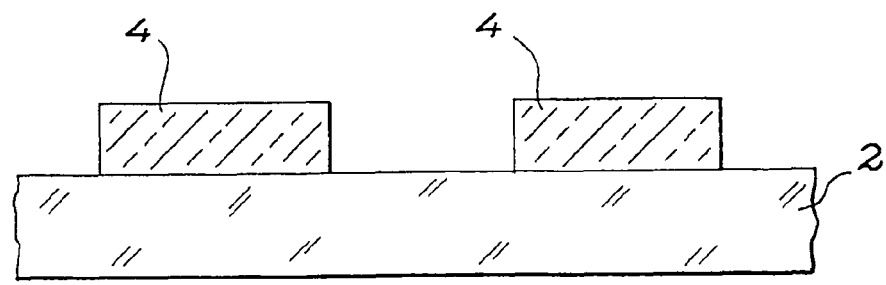
FIG. 1
Prior Art
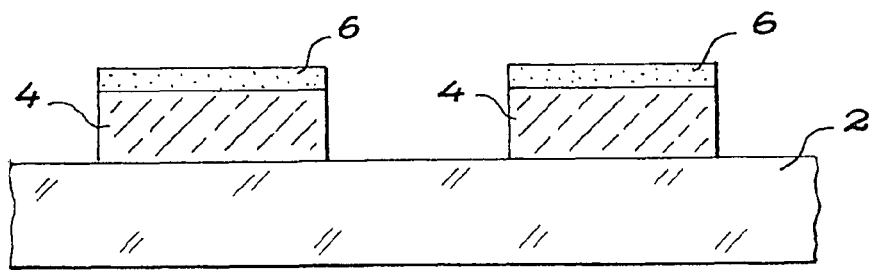
FIG. 2
Prior Art
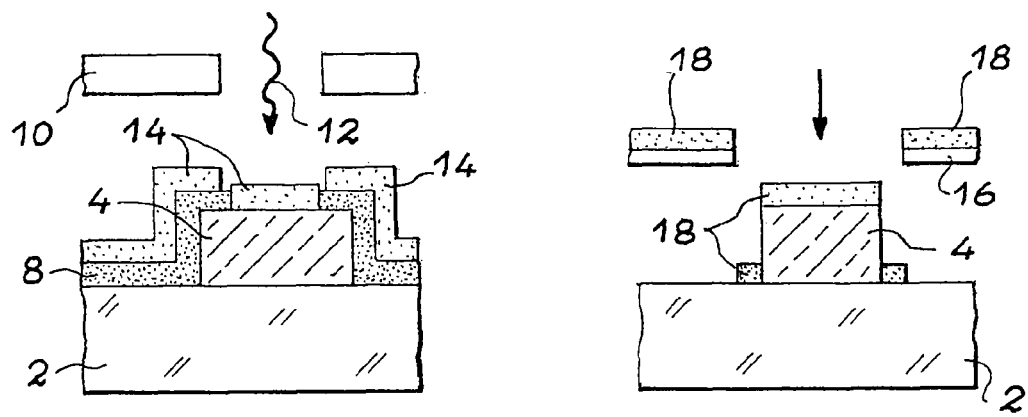
FIG. 3
Prior Art
FIG. 4
Prior Art

METHOD FOR PRODUCING LAYERS LOCATED ON A HYBRID CIRCUIT

TECHNICAL AREA

The present invention concerns a method for obtaining layers defined on a hybrid circuit.

The invention relates to micro-electronic techniques allowing the accurate defining on a substrate (generally a semiconductor wafer) of at least one pattern of a material forming a layer e.g. a thin layer.

The invention particularly applies to semiconductor wafers forming reading circuits for example, on which chips are hybridized e.g. optoelectronic chips on each of which it is desired to pattern at least one layer of a given material e.g. an antireflection layer.

PRIOR ART

FIG. 1 schematically illustrates the problem of obtaining layers patterned on a hybrid circuit.

In this FIG. 1, a substrate 2 can be seen on which chips 4 are hybridized e.g. using the flip-chip technique.

This hybridization can be obtained by means of solder microballs, or using the Anisotropy Conductive Film technique, or by bonding.

It is desired to coat the back-end of each chip 4 with a layer 6 which may be a thin layer and is made in a determined material, as schematically shown FIG. 2.

In addition, it is often desired that each thin layer 6 should finish, with extreme accuracy, at the edges of the corresponding chip 4.

Three techniques are already known allowing patterned layers to be obtained on a hybrid circuit.

Again considering the example of FIGS. 1 and 2, the first known technique consists of depositing each thin layer 6 on the back-end of the corresponding chip 4 before cutting the chip and hence before its hybridization.

The second known technique, which is the most accurate of the three, is schematically illustrated FIG. 3.

According to this second known technique, the substrate 1, on which each chip 4 is hybridized, is coated with a layer 8 of photoresist.

Then, via a suitable mask 10 and using ultraviolet radiation 12, those areas of the layer 8 are exposed on which a material is to be deposited, and the photoresist exposed in this manner is developed.

Afterwards, a thin layer 7 of this material is deposited over the entire surface of the assembly thus obtained.

The excess material is then removed from the non-exposed areas using the so-called <<lift-off>> technique.

The third known technique is schematically illustrated FIG. 4.

According to this third known technique, a precise mechanical mask 16 is made.

This mask is provided with a window facing each chip 4.

This mask is fixed to the substrate 2 using means, not shown, and by aligning the mask 16 and substrate 2 with extreme accuracy.

A thin layer 18 of the material is then deposited on the back-end of each chip 4 through this mask 16.

These three known techniques have disadvantages.

The deposit technique before hybridization therefore consists of depositing the thin layer on the back-end of the chips before their hybridization.

This technique is not applicable when the material of the thin layer is unable to withstand the conditions imposed by hybridization (temperature or pressure conditions for example) and when depositing of this material must take place after hybridization of the chips.

This technique is not applicable either when the hybridized chips must be thinned down to thicknesses that are so narrow that their hybridization would be impossible, which means that the thinning of these chips must be performed after their hybridization.

This thinning generally entails imparting a thickness of a few dozen micrometers to the chips.

In this respect, reference may be made to the following documents which describe such a case:

(1) FR-A-2 715 002 (<<Electromagnetic radiation detector and method of fabrication>>)

(2) EP-A0 662 721 corresponding to document (1)

(3) U.S. Pat. 5,574,285 also corresponding to document (1).

The second and third known techniques, mentioned above, are masking techniques.

The photolithography technique by <<lift-off>> leads to good accuracy, but is not adapted to photoresists which are to be deposited on thick steps (edges of chips 4 in FIG. 2).

It is therefore necessary to focus the image of the mask used, either on the photoresist positioned on the top of the substrate or on the photoresist positioned on the top of the hybridized chip, and hence to make provision for offset between the edge of each thin layer and the edge of the corresponding chip.

The masking technique using a mechanical mask is imprecise, and its best guaranteed accuracy is only to within 20 μm for fabricating the mask and aligning it with the substrate.

DESCRIPTION OF THE INVENTION

The purpose of the present invention is to overcome these preceding disadvantages.

Its subject is a method for obtaining at least one layer defined on a hybrid circuit, this hybrid circuit comprising a substrate and at least one elementary circuit, this elementary circuit comprising a first facet and a second facet, being hybridized to a facet of the substrate via this second facet, this method being characterized in that it comprises the following steps:

a first layer is formed on the hybrid circuit so that this first layer covers this facet of the substrate and each elementary circuit, the first layer is removed from the first facet of each elementary circuit, part of this first layer subsisting on the hybrid circuit, a second layer is formed on the hybrid circuit so that this second layer covers this first facet and this part of the first layer, and this part of the first layer is removed with that part of the second layer which covers this part of the first layer, another part of the second layer thereby remaining defined on the first facet of each elementary circuit.

Preferably, this second layer is a thin layer i.e. a layer whose thickness is less than 2 μm.

According to one particular embodiment of the method subject of the invention, the first layer is removed by polishing from the first facet of each elementary circuit.

Said part of the first layer can be removed chemically or using a plasma.

The first layer may be a polymer layer.

The second layer may be an antireflection layer or a metal layer.

The invention has various advantages which are set forth below.

The invention can be used in those cases in which the first technique cannot be used, in particular when the hybridized chips must be thinned to very narrow thickness, which requires thinning after hybridization.

The invention also has advantages related to accuracy.

Contrary to the second and third known techniques, the invention enables perfect alignment of a thin layer with the top of an elementary circuit such as a chip 2 in FIG. 2.

Self-alignment is ensured and no precision aligning step is required with the invention.

The invention also has advantages regarding its ease and the apparatus required for its implementation.

The photolithography technique requires the use of at least:
- precise photoresist spreading means,
- a precise aligning system,
- one mask per type of product (circuit), topologies differing from one product to another,
- a development system, and
- photoresists which withstand vacuum depositing.

In addition, the spreading of a photoresist layer of constant thickness (particular to precise photolithography) is practically impossible on a surface on which hybridized chips may project by 500 μm and even more.

As for the mechanical mask technique, this requires:
- one type of mask per type of product,
- several masks per batch of wafers, for a process during which a set of wafers (substrates) is treated,
- precise mechanical aligning equipment to align a wafer precisely with the corresponding mask, and
- specific equipment for thin layer depositing.

With this masking technique using a mechanical mask, it is to be noted that depositing a thin layer wafer by wafer is possible, but that a wafer with its aligned, joined mask must necessarily be treated.

To implement the method subject of the invention, no mask pattern or metal mask is needed.

In addition, the first layer which is a polymer layer for example, can be spread most imprecisely and be fairly thick, since this first layer only has a protective function (and is not used for a photolithography).

Also, a basic polisher can be used to remove that part of the first layer lying on the top of each elementary circuit.

The method subject of the invention can also be used with all wafer/wafer equipment (allowing spreading, polishing and depositing).

The invention also has advantages compared with the known techniques regarding the cost of implementation.

The method subject of the invention does not require the development of tooling for each new product.

Also standard wafer on wafer equipment and low cost consumables (e.g. non-photosensitive polymers) are sufficient for its implementation.

BRIEF DESCRIPTION OF THE DRAWINGS

The present invention will be better understood on reading the description of examples of embodiment given below, solely for guidance purposes and in no way limiting, with reference to the appended drawings in which:

FIG. 1, already described, schematically shows a substrate and chips hybridized to this substrate, FIG. 2, already described, schematically shows layers patterned on these chips, FIGS. 3 to 4, already described, schematically illustrate known techniques for obtaining the hybrid circuit seen in FIG. 2, and FIGS. 5 to 8 schematically show steps of one particular embodiment of the method subject of the invention.

DETAILED DESCRIPTION OF PARTICULAR EMBODIMENTS

Figure 5:
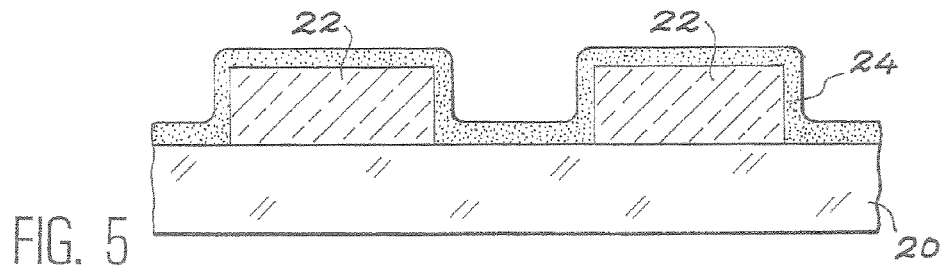

In this particular embodiment of the method subject of the invention, illustrated FIGS. 5 to 8, a hybrid circuit can be seen FIG. 5, which comprises a substrate 20 and an elementary circuit or a plurality of elementary circuits 22.

Each elementary circuit 22 is hybridized, via its lower facet, to a facet of the substrate 20, and it is desired to form a layer in a determined material on the upper facet of each elementary circuit.

By way of example, the substrate 20 is a silicon wafer 100 mm in diameter, and each elementary circuit 22 is an optoelectronic circuit.

During a first step, schematically illustrated FIG. 5, a layer of polymer 24 is deposited on the upper facet of the substrate, on which circuits 22 are hybridized.

This polymer layer 24 therefore covers this upper facet of the substrate and these circuits 22.

For example, the polymer is a photoresist which is spread using a spinner chuck to achieve a thickness of 5 μm.

The photoresist layer is then dried.

Figure 6:
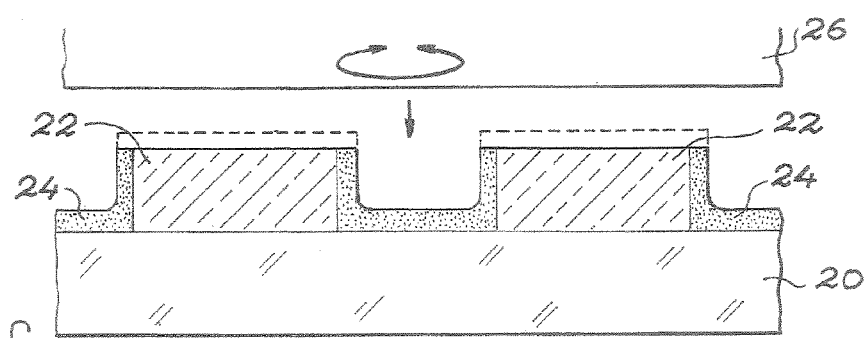

At a second step, schematically illustrated FIG. 6, the upper facet of the substrate 20, provided with circuits 22 and with the polymer layer 24, is subjected to mechanical polishing e.g. using a standard polishing machine 26, to remove all the polymer layer covering the upper facet of each circuit 22 and a thickness of this circuit 22.

For example, polishing is performed over a thickness of 50 μm when the thickness of the polymer layer is 5 μm.

Figure 7:
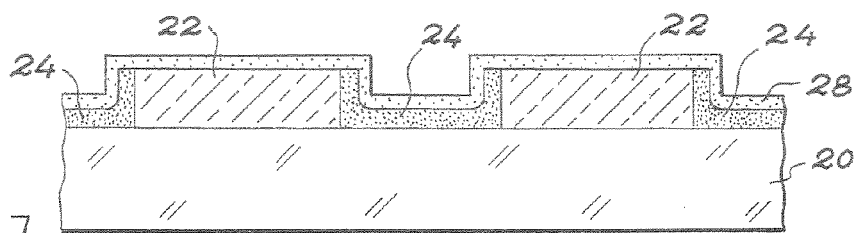

At a third step, schematically illustrated FIG. 7, the entire substrate 20 is coated with a thin layer 28 whose thickness is 0,5 μm for example, and which is an antireflection layer for example.

For this purpose, a thin layer depositing machine is used, with cassette by cassette loading for example.

Figure 8:
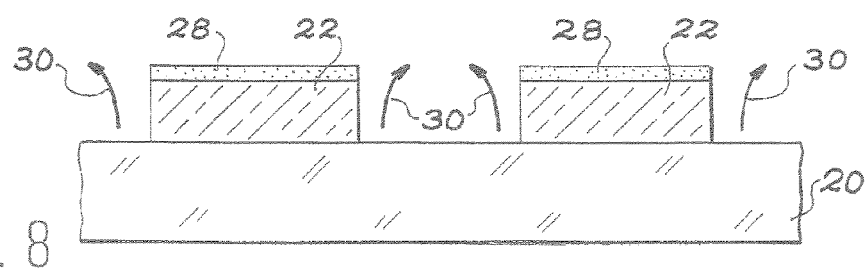

At a fourth step, schematically illustrated FIG. 8, the remaining parts of the polymer layer 24 are decomposed e.g. chemically or using a plasma (or any other means), and on decomposing they carry away those parts of the thin layer 28 which are located above these remaining parts of the polymer layer.

This is symbolically shown by the arrows 30 in FIG. 8.

For example, the technique called <<lift-off>> is used to remove the photoresist (e.g. using acetone).

Some applications of the invention are indicated below.

In the area of optoelectronics, it is often necessary to hybridize an optoelectronic chip onto a reading circuit in silicon (as is the case with photon detectors and emitting lasers of VCSEL type).

This hybridization is made using <<flip-chip>> technology and solder microballs.

It is often followed by thinning of the hybridized chip [see documents (1) to (3)].

It is then preferable to form an anti-reflection layer on the rear side of the hybridized chip:
- to enable better emission in the case of an emitting circuit (e.g. VCSEL), or
- to enable better detection, in the case of a detector circuit (in the infrared range or visible range for example).

It may also be necessary, on other types of circuits, to add a contact via the back-end, which can b easily achieved with the invention: in this case a metal deposit is made instead of a deposit of anti-reflection material.

This is the case for example with thinned horizontal cavity lasers.

One important application of the invention, for infrared components of coated-thinned type, is the depositing of a layer of antireflection material on the back-end of the detection area of this component.

Documents (1) to (3) can be consulted for the description of said coated-thinned component.

The invention claimed is:

1. A method for obtaining at least one layer defined on a hybrid circuit, the hybrid circuit including a substrate and at least one elementary circuit, the elementary circuit including a first facet and a second facet and being hybridized via the second facet to a facet of the substrate, the method comprising:

forming a first layer on the hybrid circuit so that the first layer covers the facet of the substrate and each elementary circuit;

removing the first layer from the first facet of each elementary circuit, a part of the first layer subsisting on the hybrid circuit;

forming a second layer on the hybrid circuit so that the second layer covers the first facet and the part of the first layer; and removing the part of the first layer with a part of the second layer covering the part of the first layer, the part of the second layer thereby remaining defined on the first facet of each elementary circuit.

2. A method according to claim 1, wherein the second layer has a thickness less than 2 µm.

3. A method according to claim 1, wherein the first layer is removed by polishing from the first facet of each elementary circuit.

4. A method according to claim 1, wherein the part of the first layer is removed chemically or using a plasma.

5. A method according to claim 1, wherein the first layer is a layer of polymer.

6. A method according to claim 1, wherein the second layer is an antireflection layer.

7. A method according to claim 1, wherein the second layer is a metal layer.

* * * * *